(12) United States Patent  
Chen et al.

(10) Patent No.: US 12,266,618 B2
(45) Date of Patent: Apr. 1, 2025

(54) SEMICONDUCTOR DEVICE AND METHOD OF MANUFACTURING THE SAME

(71) Applicant: Advanced Semiconductor Engineering, Inc., Kaohsiung (TW)

(72) Inventors: Jenchun Chen, Kaohsiung (TW); Shyue-Long Louh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 378 days.

(21) Appl. No.: 17/676,086

(22) Filed: Feb. 18, 2022

(65) Prior Publication Data

US 2023/0268295 A1    Aug. 24, 2023

(51) Int. Cl.
| | |
|---|---|
| *H01L 23/66* | (2006.01) |
| *H01L 23/498* | (2006.01) |
| *H01L 23/552* | (2006.01) |
| *H01Q 1/22* | (2006.01) |
| *H01L 21/56* | (2006.01) |
| *H01L 25/16* | (2023.01) |
| *H01Q 1/38* | (2006.01) |

(52) U.S. Cl.
CPC ........ *H01L 23/66* (2013.01); *H01L 23/49816* (2013.01); *H01L 23/552* (2013.01); *H01Q 1/2283* (2013.01); *H01L 21/565* (2013.01); *H01L 25/165* (2013.01); *H01L 2223/6616* (2013.01); *H01L 2223/6677* (2013.01); *H01L 2223/6688* (2013.01); *H01Q 1/38* (2013.01)

(58) Field of Classification Search
CPC . H01L 23/66; H01L 23/49816; H01L 23/552; H01L 21/565; H01L 25/165; H01L 2223/6616; H01L 2223/6677; H01L 2223/6688; H01L 23/5389; H01L 23/3128; H01Q 1/2283; H01Q 1/38; H01Q 19/062; H01Q 5/42; H01Q 21/08; H01Q 21/28; H01Q 5/30
USPC ........................................... 257/728
See application file for complete search history.

(56) References Cited

U.S. PATENT DOCUMENTS

| | | | | |
|---|---|---|---|---|
| 6,815,739 | B2* | 11/2004 | Huff ...................... | B82Y 30/00 438/455 |
| 7,830,312 | B2* | 11/2010 | Choudhury .............. | H01Q 3/26 343/700 MS |
| 8,278,749 | B2* | 10/2012 | Lachner ................ | H01Q 9/0457 257/773 |
| 8,901,688 | B2* | 12/2014 | Kamgaing ......... | H01Q 21/0087 257/659 |

(Continued)

OTHER PUBLICATIONS

U.S. Appl. No. 17/716,922, Chen et al.

(Continued)

*Primary Examiner* — Vu A Vu
(74) *Attorney, Agent, or Firm* — FOLEY & LARDNER LLP

(57) ABSTRACT

The present disclosure provides a semiconductor device. The semiconductor device includes a carrier having a first side and a second side adjacent to the first side. The semiconductor device also includes a first antenna adjacent to the first side and configured to operate at a first frequency and a second antenna adjacent to the second side and configured to operate at a second frequency different from the first frequency. An method of manufacturing a semiconductor device is also provided.

18 Claims, 18 Drawing Sheets

(56) References Cited

U.S. PATENT DOCUMENTS

| | | | |
|---|---|---|---|
| 9,620,464 B2 * | 4/2017 | Baks | H01Q 9/0457 |
| 9,917,372 B2 * | 3/2018 | Tong | G01S 13/02 |
| 9,923,279 B2 * | 3/2018 | Lipowski | H01Q 21/061 |
| 10,103,447 B2 * | 10/2018 | Tong | H01L 31/0203 |
| 10,263,346 B2 * | 4/2019 | Kamgaing | H01Q 23/00 |
| 10,756,033 B2 * | 8/2020 | Dalmia | H01L 23/5226 |
| 10,971,825 B2 * | 4/2021 | Kang | H01Q 9/0414 |
| 10,978,434 B2 * | 4/2021 | Cheah | H01Q 21/22 |
| 11,024,981 B2 * | 6/2021 | Chiang | H01Q 7/00 |
| 11,115,510 B1 * | 9/2021 | Abdul-Gaffoor | H01Q 21/08 |
| 11,404,788 B1 * | 8/2022 | Wang | H01Q 1/243 |
| 11,411,315 B2 * | 8/2022 | Onaka | H01Q 5/371 |
| 11,710,908 B2 * | 7/2023 | Cao | H01Q 1/521 343/702 |
| 11,756,902 B2 * | 9/2023 | Ueda | H01Q 5/378 257/728 |
| 11,936,123 B2 * | 3/2024 | Arai | H01Q 9/0435 |
| 2016/0308287 A1 | 10/2016 | Kamgaing et al. | |
| 2017/0237154 A1 | 8/2017 | Choudhury et al. | |
| 2018/0102353 A1 | 4/2018 | Pagani | |
| 2019/0139915 A1 | 5/2019 | Dalmia et al. | |
| 2019/0288382 A1 | 9/2019 | Kamgaing et al. | |
| 2019/0372198 A1 | 12/2019 | Dalmia et al. | |
| 2019/0379139 A1 | 12/2019 | Takizawa et al. | |
| 2020/0153110 A1 | 5/2020 | Kim et al. | |
| 2020/0212537 A1 | 7/2020 | Chuang et al. | |
| 2020/0365971 A1 | 11/2020 | Moallem et al. | |
| 2021/0183775 A1 | 6/2021 | Lim et al. | |
| 2022/0157746 A1 | 5/2022 | Ho et al. | |
| 2022/0247089 A1 | 8/2022 | Hartner et al. | |
| 2023/0299461 A1 * | 9/2023 | Takasugi | H05K 3/46 257/728 |

OTHER PUBLICATIONS

Non-Final Office Action for U.S. Appl. No. 17/716,922, issued May 31, 2023, 12 pages.
Final Office Action for U.S. Appl. No. 17/716,922, issued Jan. 8, 2024, 11 pages.
Non-Final Office Action for U.S. Appl. No. 17/716,922, issued Jul. 25, 2024, 17 pages.
Final Office Action for U.S. Appl. No. 17/716,922, issued Jan. 10, 2025, 16 pages.

* cited by examiner

SEMICONDUCTOR DEVICE AND METHOD OF MANUFACTURING THE SAME

BACKGROUND

1. Field of the Disclosure

The present disclosure generally relates to a semiconductor device and a method of manufacturing a semiconductor device.

2. Description of the Related Art

To reduce the size and achieve a higher integration of semiconductor device packages, several packaging solutions, such as Antenna in Package (AiP) and Antenna on Package (AoP) have been developed and implemented.

However, to support the industry's demand for increased electronic functionality, the size and/or form factor of the semiconductor device packages will inevitably be increased, and some applications may be limited (e.g., in portable devices).

SUMMARY

In some embodiments, a semiconductor device includes a carrier having a first side and a second side adjacent to the first side. The semiconductor device also includes a first antenna adjacent to the first side and configured to operate at a first frequency and a second antenna adjacent to the second side and configured to operate at a second frequency different from the first frequency.

In some embodiments, a semiconductor device includes a first antenna and a connector adjacent to the first antenna and configured to provide an external connection. The semiconductor device also includes a second antenna at least partially under the connector and the first antenna.

In some embodiments, a method of manufacturing semiconductor device includes disposing a supporting element on a first side of a carrier and disposing a first antenna on the supporting element. The first antenna is configured to operate at a first frequency. The method also includes disposing a second antenna on a second side of the carrier. The second antenna is configured to operate at a second frequency.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
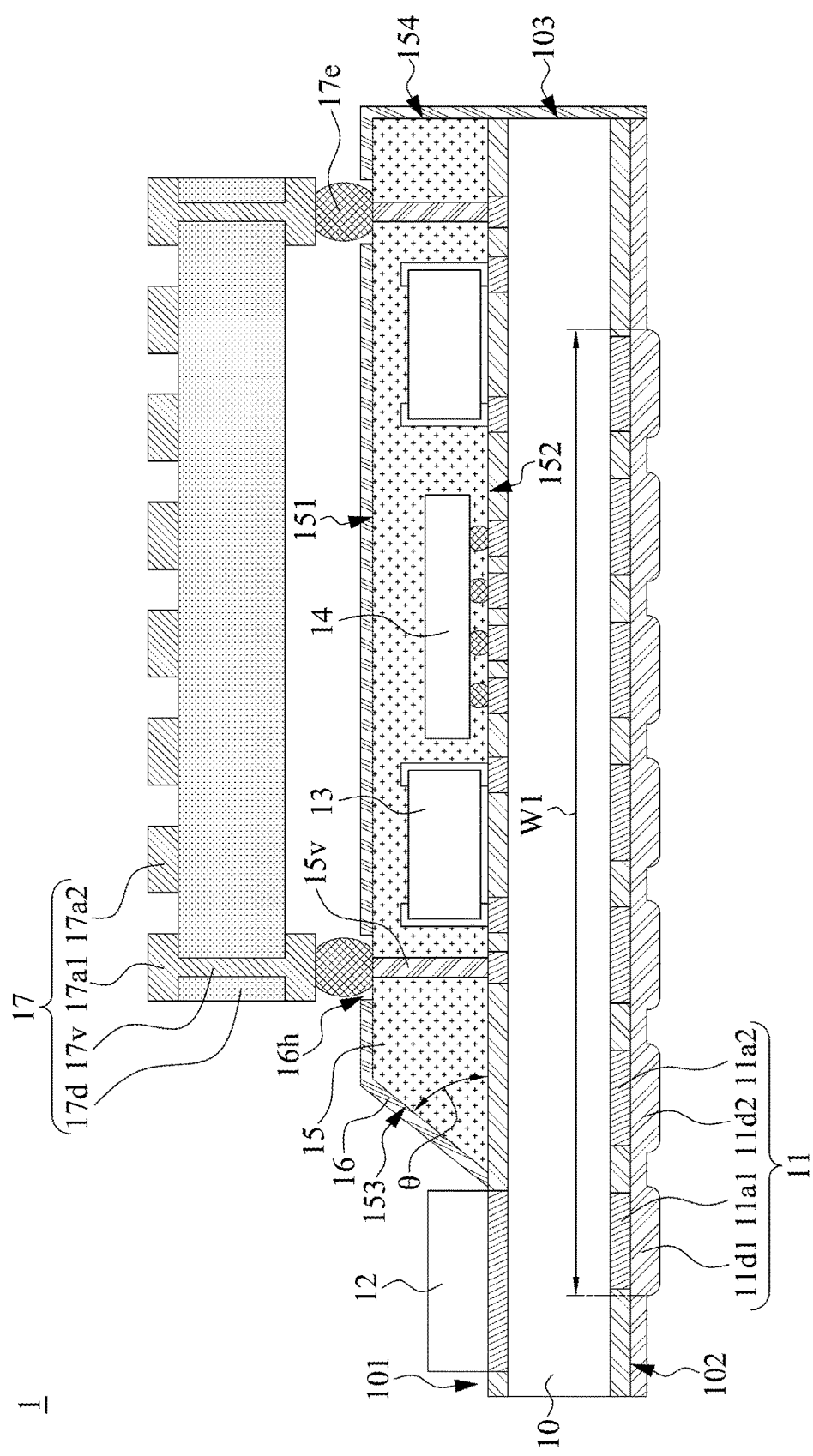
FIG. 1A is a cross-sectional view of a semiconductor device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of a semiconductor device 1, in accordance with an embodiment of the present disclosure. In some embodiments, the semiconductor device 1 may be or include, for example, an antenna device or an antenna package. In some embodiments, the semiconductor device 1 may be or include, for example, a wireless device, such as a user equipment (UE), a mobile station, a mobile device, an apparatus communicating with the Internet of Things (IoT), etc. In some embodiments, the semiconductor device 1 may be or include a portable device.

Referring to FIG. 1A, the semiconductor device 1 includes a carrier 10, an antenna layer 11, a connector 12, electronic components 13, 14, a supporting element 15, a shielding layer 16, and an antenna module 17.

In some embodiments, the carrier 10 may be or include, for example, a substrate. In some embodiments, the carrier 10 may be or include, for example, a printed circuit board, such as a paper-based copper foil laminate, a composite copper foil laminate, or a polymer-impregnated glass-fiber-based copper foil laminate.

The carrier 10 may have a surface 101 (which may also be referred to as a first side), a surface 102 (which may also be referred to as a second side) adjacent to the surface 101, and a lateral surface 103 extending between the surface 101 and the surface 102. The surface 102 may be opposite to the surface 101.

In some embodiments, the carrier 10 may include conductive pad(s), trace(s), via(s), layer(s), or other interconnection(s). For example, the carrier 10 may include one or more transmission lines (e.g., communications cables) and one or more grounding lines and/or grounding planes. For example, the carrier 10 may include one or more conductive pads (not annotated in the figures) in proximity to, adjacent to, or embedded in and exposed at the surface 101 and/or the surface 102 of the carrier 10. The carrier 10 may include a solder resist (not annotated in the figures) on the surface 101 and/or the surface 102 to fully expose or to expose at least a portion of the conductive pads for electrical connections.

The antenna layer 11 may be adjacent to or disposed on the surface 102 of the carrier 10. The antenna layer 11 may be supported by the carrier 10. The antenna layer 11 may be a part of the carrier 10. For example, the antenna layer 11 may include a part of a conductive layer or a circuit layer of the carrier 10. At least a portion of the antenna layer 11 may be exposed from the solder resist of the carrier 10.

In some embodiments, the antenna layer 11 may be at least partially under the connector 12 and the antenna module 17. For example, in a direction substantially perpendicular to the surface 101 and/or the surface 102 of the carrier 10, the antenna layer 11 and the connector 12 may be overlapping. For example, in a direction substantially perpendicular to the surface 101 and/or the surface 102 of the carrier 10, the antenna layer 11 and the antenna module 17 may be overlapping.

In some embodiments, the radiating area of the antenna layer 11 may include a dimension or a width "W1" measured along a direction substantially parallel to the surface 101 and/or the surface 102 of the carrier 10. The radiating area of the antenna layer 11 may be the exposing area of the antenna elements of the antenna layer 11. The width W1 of the radiating area of the antenna layer 11 may be at least partially under the connector 12 and the antenna module 17.

The antenna layer 11 may be configured to radiate and/or receive electromagnetic signals, such as radio frequency (RF) signals. In some embodiments, the antenna layer 11 may include an antenna array or an antenna pattern. For example, the antenna layer 11 may include a plurality of antennas (or antenna elements), such as the antennas 11a1 and 11a2. The antenna layer 11 may also include a plurality of dielectric layers, such as the dielectric layers 11d1 and 11d2.

In some embodiments, the antennas 11a1 and 11a2 may be of any suitable type, such as patch antennas, slot-coupled antenna, stacked patches, dipoles, monopoles, etc., and may have different orientations and/or polarizations.

In some embodiments, the antennas 11a1 and 11a2 may have different frequencies (or operating frequencies) or bandwidths (or operating bandwidths). For example, the antennas 11a1 and 11a2 may be configured to operate at different frequencies. For example, the antenna 11a1 may have a frequency higher than a frequency of the antenna 11a2, or vice versa.

In some embodiments, the antennas 11a1 and 11a2 may each include a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

In some embodiments, the dielectric layer 11d1 may be disposed on the antenna 11a1. The dielectric layer 11d1 may cover the antenna 11a1. Similarly, the dielectric layer 11d2 may be disposed on the antenna 11a2. The dielectric layer 11d2 may cover the antenna 11a2. In some embodiments, the dielectric layer 11d1 and the dielectric layer 11d2 may be connected or continuous. However, in some other embodiments, the dielectric layer 11d1 and the dielectric layer 11d2 may be physically separated. The dielectric layer 11d1 and the dielectric layer 11d2 may be elements configured to focus electromagnetic signals radiated or received by the antenna 11a1 and the antenna 11a2.

In some embodiments, the dielectric layer 11d1 and the dielectric layer 11d2 may each include pre-impregnated composite fibers ("pre-preg"), Borophosphosilicate Glass (BPSG), silicon oxide, silicon nitride, silicon oxynitride, Undoped Silicate Glass (USG), any combination thereof, or the like. Examples of a pre-preg may include, but are not limited to, a multi-layer structure formed by stacking or laminating a number of pre-impregnated materials/sheets. In some embodiments, the dielectric layer 11d1 and the dielectric layer 11d2 may each include a relatively higher dielectric constant (Dk) material. For example, a Dk of the dielectric layer 11d1 (or the dielectric layer 11d2) may be between about 18 and about 25. For example, a Dk of the dielectric layer 11d1 (or the dielectric layer 11d2) may be greater than a Dk of the carrier 10. For example, a Dk of the dielectric layer 11d1 (or the dielectric layer 11d2) may be greater than a Dk of the supporting element 15. In some embodiments, a dissipation factor (Df) of the dielectric layer 11d1 and the dielectric layer 11d2 may be less than about 0.006.

In some embodiments, the dielectric layer 11d1 and the dielectric layer 11d2 may each include a dielectric resonator antenna. The dielectric resonator antenna may be configured to have various shapes. In some arrangements, the electromagnetic signals radiated from the antenna elements may be introduced into the inside of the resonator material and bounce back and forth between the resonator walls, forming standing waves. In some arrangements, the dielectric resonator antenna may be configured to increase antenna gain, to increase bandwidth, and/or to adjust resonant frequency and impedance of the electromagnetic signals radiated from the antenna elements.

The connector 12 may be adjacent to or disposed on the surface 101 of the carrier 10. The connector 12 may be spaced apart from the antenna module 17. The connector 12 may be spaced apart from the supporting element 15. The connector 12 may be configured to provide external connections. For example, the connector 12 can provide electrical connections between the semiconductor device 1 and external components (e.g., external circuits or circuit boards). In some embodiments, the connector 12 may include a conductive pillar, a solder ball, a conductive wire, a board-to-board connector, a connector for HotBar soldering, a combination thereof, or any other feasible connectors.

The electronic components 13 and 14 may be adjacent to or disposed on the surface 101 of the carrier 10. The electronic components 13 and 14 may be disposed between the surface 101 of the carrier 10 and the antenna module 17. The electronic components 13 and 14 may be electrically connected to one or more other electrical components (if any) and to the carrier 10 (e.g., to the interconnection(s)), and the electrical connection may be attained by way of flip-chip, wire-bond techniques, metal to metal bonding (such as Cu to Cu bonding), or hybrid bonding.

In some embodiments, the electronic component 13 may include a passive device such as a resistor, a capacitor, an inductor, or a combination thereof. In some embodiments, the electronic component 14 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 14 may include a system on chip (SoC). For example, the electronic component 14 may include a radio frequency integrated circuit (RFIC), an application-specific IC (ASIC), a central processing unit (CPU), a microprocessor unit (MPU), a graphics processing unit (GPU), a microcontroller unit (MCU), a field-programmable gate array (FPGA), or another type of IC.

In some embodiments, the electronic components 13 and 14 may be at least partially under the antenna module 17. For example, in a direction substantially perpendicular to the surface 101 and/or the surface 102 of the carrier 10, the electronic component 13 and the antenna module 17 may be overlapping. For example, in a direction substantially perpendicular to the surface 101 and/or the surface 102 of the carrier 10, the electronic component 14 and the antenna module 17 may be overlapping.

Although there are three electronic components in FIG. 1A, the number of the electronic components is not limited thereto. In some embodiments, there may be any number of electronic components depending on design requirements.

In some embodiments, the supporting element 15 may be formed on the surface 101 of the carrier 10 to encapsulate the electronic components 13 and 14. The connector 12 may be exposed from the supporting element 15. In some embodiments, the supporting element 15 may be configured to support the antenna module 17. The supporting element 15 may separate the antenna module 17 from the antenna layer 11.

In some embodiments, the supporting element 15 may include a surface 151 facing away from the carrier 10, a surface 152 opposite to the surface 151, and multiple lateral surfaces (such as the lateral surfaces 153 and 154) extending between the surface 151 and the surface 152. The surface 152 may face and contact the carrier 10. The lateral surface 153 may face the connector 12.

In some embodiments, the lateral surface 153 of the supporting element 15 may define an angle "θ" with the surface 101 of the carrier 10. In some embodiments, the angle θ may be less than about 90 degrees.

In some embodiments, the supporting element 15 may include an encapsulant. In some embodiments, the supporting element 15 may include an epoxy resin having fillers, a molding compound (e.g., an epoxy molding compound or other molding compound), a polyimide, a phenolic compound or material, a material with a silicone dispersed therein, or a combination thereof. In some embodiments, the supporting element 15 may include a low Dk and low Df dielectric material, such as a material having a dielectric constant approximately equal to and less than 4.0.

In some embodiments, one or more conductive elements 15v may be disposed in the supporting element 15. The conductive element 15v may extend between the surface 151 and the surface 152. A part of the conductive element 15v may be exposed from the surface 151. The conductive element 15v may be electrically connected between the carrier 10 and the antenna module 17. The conductive element 15v may include a conductive pillar or a conductive via.

The shielding layer 16 may be disposed on the supporting element 15. For example, the shielding layer 16 may be disposed on the external surfaces (e.g., the surface 151 and the lateral surfaces 153 and 154) of the supporting element 15. In some embodiments, the shielding layer 16 may disposed between the supporting element 15 and the antenna module 17.

In some embodiments, the shielding layer 16 may also be disposed on the lateral surface 103 of the carrier 10. In some embodiments, the shielding layer 16 may contact a grounding layer in the carrier 10. In some embodiments, the shielding layer 16 and the antenna elements (e.g., the antenna 11a1 and the antenna 11a2) may be non-overlapping in a direction substantially parallel to the surface 101 and/or the surface 102 of the carrier 10. For example, in a direction substantially parallel to the surface 101 and/or the surface 102 of the carrier 10, the antenna elements (e.g., the antenna 11a1 and the antenna 11a2) may not be covered by the shielding layer 16.

In some embodiments, the shielding layer 16 may be configured to provide an electromagnetic interference (EMI) shielding protection. For example, the shielding layer 16 may be configured to provide an EMI shielding to prevent the electronic component 14 from being interfered with by other electronic components, and vice versa.

In some embodiments, the shielding layer 16 may define one or more openings 16h over the surface 151 of the supporting element 15. A part of the conductive element 15v may be exposed from the opening 16h.

In some embodiments, the shielding layer 16 may include copper (Cu) or other conductive materials, such as aluminum (Al), chromium (Cr), tin (Sn), gold (Au), silver (Ag), nickel (Ni) or stainless steel, another metal, or a mixture, an alloy, or other combinations of two or more thereof. In some embodiments, the shielding layer 16 may be or include a conductive layer or a conductive thin film. In some embodiments, the shielding layer 16 may be implemented using a conformal molding with a sputtered shield (such as shown in FIG. 5F and FIG. 6E). In some embodiments, the shielding layer 16 may be or include a multi-layered structure. For example, layers of the shielding layer 16 from the inside to the outside may include a seed layer (such as porous stainless steel, SUS), a conductive layer (such as Cu), and a protection layer (such as SUS).

The antenna module 17 may be adjacent to or disposed on the surface 101 of the carrier 10. The antenna module 17 may be adjacent to or disposed on the surface 151 of the supporting element 15. The antenna module 17 may be supported by the carrier 10 and the supporting element 15. The antenna module 17 may be separated from the antenna layer 11 by the carrier 10 and the supporting element 15.

At least a part of the antenna module 17 may be over the antenna layer 11. For example, in a direction substantially perpendicular to the surface 101 and/or the surface 102 of the carrier 10, the antenna module 17 and the antenna layer 11 may be overlapping. For example, in a direction substantially perpendicular to the surface 101 and/or the surface 102 of the carrier 10, a part of the antenna layer 11 may be covered by the antenna module 17 and a part of the antenna layer 11 may be exposed from the antenna module 17.

The antenna module 17 may be electrically connected to the carrier 10 through conductive elements 17e. For example, the conductive elements 17e may comprise solder balls, solder bumps, copper bumps, gold bumps, or any suitable conductive means.

The antenna module 17 may be configured to radiate and/or receive electromagnetic signals different from the electromagnetic signals of the antenna layer 11. In some embodiments, the antenna module 17 and the antenna layer 11 may have different frequencies (or operating frequencies) or bandwidths (or operating bandwidths). For example, the antenna module 17 and the antenna layer 11 may be configured to operate at different frequencies. For example, the antenna module 17 may have a frequency higher than a frequency of the antenna layer 11. In some embodiments, the antenna module 17 may support fifth generation (5G) communications, such as Sub-6 GHz frequency bands and/or millimeter (mm) wave frequency bands. For example, the antenna module 17 may incorporate both Sub-6 GHz antennas and mm wave antennas. In some embodiments, the antenna module 17 may support beyond-5G or 6G communications, such as tetrahertz (THz) frequency bands.

The antenna module 17 may include a carrier 17d, one or more conductive elements 17v, and a plurality of antennas (or antenna elements), such as the antennas 17a1 and 17a2.

The carrier 17d may be a substrate, such as a ceramic substrate, a semiconductor substrate, a dielectric substrate, a glass substrate, etc. The conductive element 17v may extend through the carrier 17d to route signals from one side of the carrier 17d to the other side of the carrier 17d. The conductive element 17v may include a conductive pillar or a conductive via.

The plurality of antennas (including the antennas 17a1 and 17a2) of the antenna module 17 may be disposed on a surface of the carrier 17d facing away from the carrier 10. The antennas of the antenna module 17 may be arranged in an array or define an antenna pattern. In some embodiments, the antennas of the antenna module 17 may be of any suitable type, such as patch antennas, slot-coupled antenna, stacked patches, dipoles, monopoles, etc., and may have different orientations and/or polarizations.

In some embodiments, the antenna module 17 may include a multiple-band antenna module. For example, the antennas 17a1 and 17a2 may have different frequencies (or operating frequencies) or bandwidths (or operating bandwidths). For example, the antennas 17a1 and 17a2 may be configured to operate at different frequencies. For example, the antenna 17a1 may have a frequency higher than a frequency of the antenna 17a2, or vice versa.

In some embodiments, the conductive elements 15v, 17e, and 17v may be feeding elements for transmitting incoming/outgoing RF signals with respect to the antennas of the antenna module 17. By using the conductive element 15v, which penetrates through the supporting element 15 as a feeding element, for the higher-band antenna (such as the antennas of the antenna module 17), the electromagnetic waves may propagate through a single dielectric layer (the supporting element 15 may include a low Dk and low Df dielectric material), and the transmission losses of the electromagnetic waves may be decreased.

According to some embodiments of the present disclosure, by arranging a higher-band antenna (such as the antennas of the antenna module 17) and a lower-band antenna (such as the antennas of the antenna layer 11) on opposite sides of the carrier 10, more antennas may be incorporated in the semiconductor device 1 without increasing the size and/or form factor of the semiconductor device 1.

In addition, the antenna module 17 and the antenna layer 11 may both include antennas configured to operate at different frequencies. The antennas on both sides may be laterally arranged or vertically arranged based on design requirements.

Figure 1B:
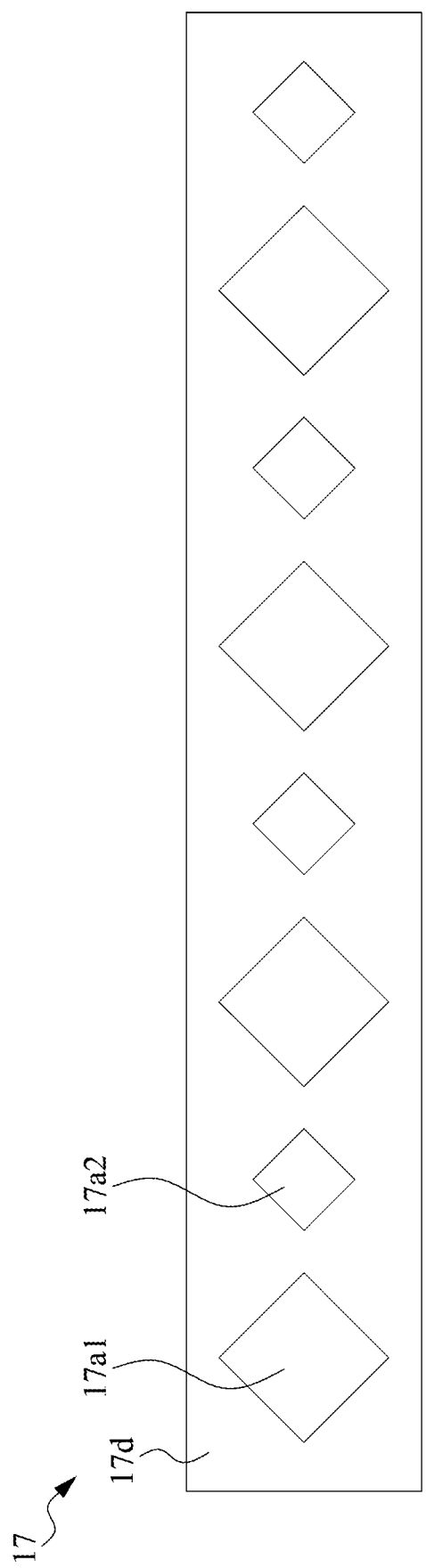
FIG. 1B is a top view of a part of a semiconductor device, in accordance with an embodiment of the present disclosure.

FIG. 1B is a top view of a part of a semiconductor device, in accordance with an embodiment of the present disclosure. In some embodiments, the top view of FIG. 1B may be a top view of a part of the semiconductor device 1 of FIG. 1A.

The plurality of antennas (including the antennas 17a1 and 17a2) of the antenna module 17 may be disposed on a surface of the carrier 17d. The size or the surface area of antenna 17a1 may be greater than the size or the surface area of antenna 17a2. The antenna 17a2 may have a frequency higher than a frequency of the antenna 17a1. The antennas 17a1 and 17a2 may be arranged in a staggered manner. The antennas 17a1 and 17a2 may be laterally spaced from each other.

Figure 2:
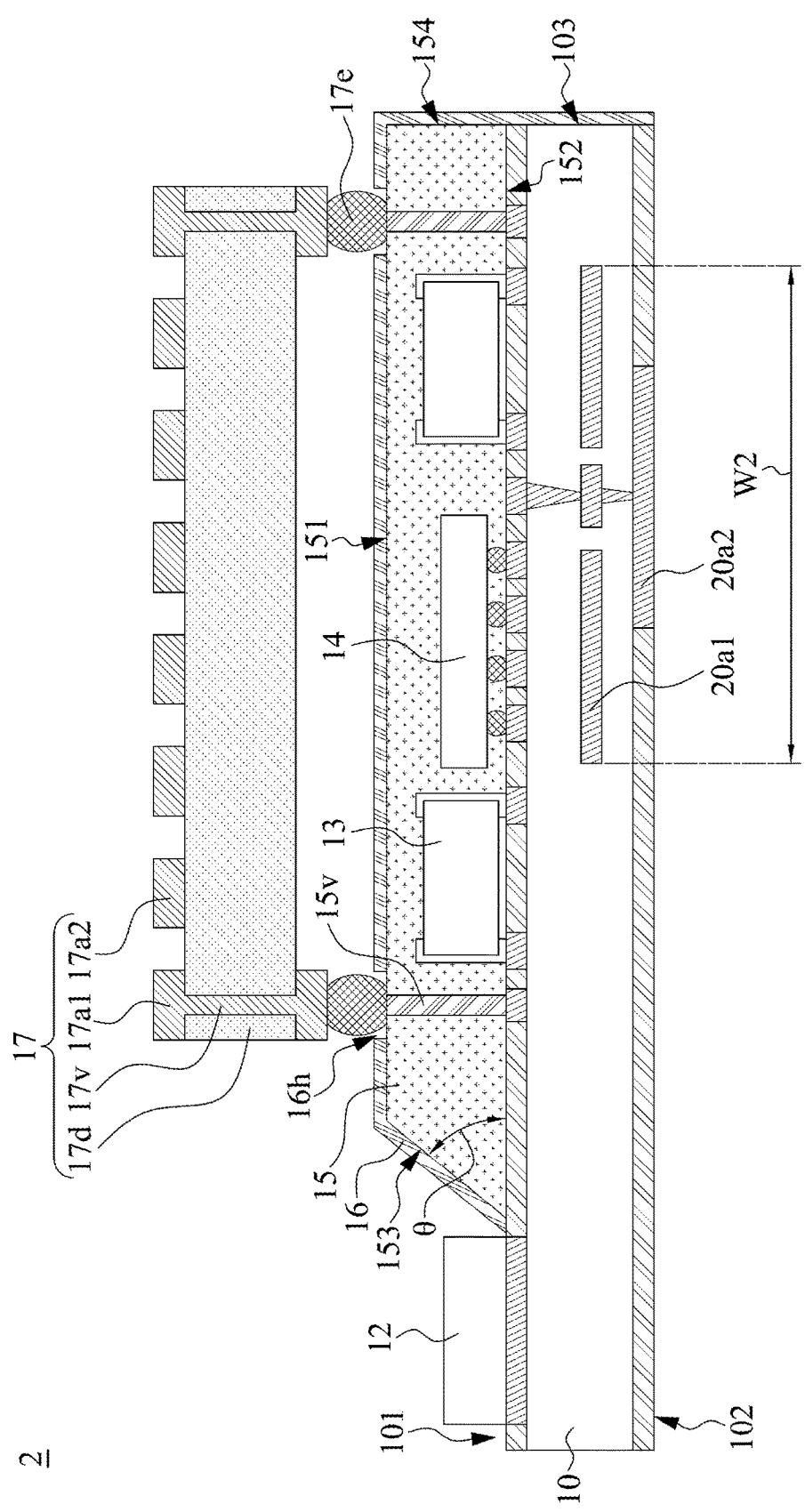
FIG. 2 is a cross-sectional view of a semiconductor device, in accordance with an embodiment of the present disclosure.

FIG. 2 is a cross-sectional view of a semiconductor device 2, in accordance with an embodiment of the present disclosure. The semiconductor device 2 is similar to the semiconductor device 1 as shown in FIG. 1A, and the differences therebetween are described below.

In comparison with the antennas 11a1 and 11a2 (laterally arranged) in semiconductor device 1, the semiconductor device 2 may include an antenna 20a1 and an antenna 20a2 vertically spaced apart from each other. For example, the antenna 20a1 and the antenna 20a2 may be partially overlapping in a direction perpendicular to the surfaces 101 and/or 102 of the carrier 10. The antenna 20a2 may have a frequency higher than a frequency of the antenna 20a1. For example, the antenna 20a2 (which can be referred to as a high-band antenna) may be configured to operate in a frequency between about 30 GHz and about 40 Ghz. For example, the antenna 20a1 (which can be referred to as a low-band antenna) may be configured to operate in a frequency between about 20 GHz and about 30 Ghz.

According to some embodiments of the present disclosure, by arranging the antenna 20a1 and the antenna 20a2 vertically (in a z-axis orientation), a dimension or a width "W2" of the antennas in the xy-plane may be shorter than the width W1 of the radiating area of the antenna layer 11 in semiconductor device 1.

In some other embodiments, the antenna 20a2 and the antenna 20a1 may not be overlapping in a direction perpendicular to the surfaces 101 and/or 102 of the carrier 10. For example, the antenna 20a2 and the antenna 20a1 may be arranged along a direction parallel to the surfaces 101 and/or 102 of the carrier 10. For example, the antenna 20a2 and the antenna 20a1 may be laterally spaced apart from each other in a direction parallel to the surfaces 101 and/or 102 of the carrier 10.

In some embodiments, the semiconductor device may have a dielectric layer (which can be referred to as a high-Dk dielectric layer) covering the antenna 20a2 (i.e., the high-band antenna) and a dielectric layer (which can be referred to as a low-Dk dielectric layer) covering the antenna 20a1 (i.e., the low-band antenna). The high-Dk dielectric layer and the low-Dk dielectric layer may respectively be sized as per the antenna 20a2 and the antenna 20a1.

The high-Dk dielectric layer and the low-Dk dielectric layer may have different dielectric constants (Dk). For example, the high-Dk dielectric layer may include a material having a relatively higher Dk (e.g., between about 18 and about 25) and the low-Dk dielectric layer may include a material having a relatively higher Dk (e.g., between about 18 and about 22). In some embodiments, a Df of the high-Dk dielectric layer and a Df of the low-Dk dielectric layer may each be less than about 0.006.

Figure 3:
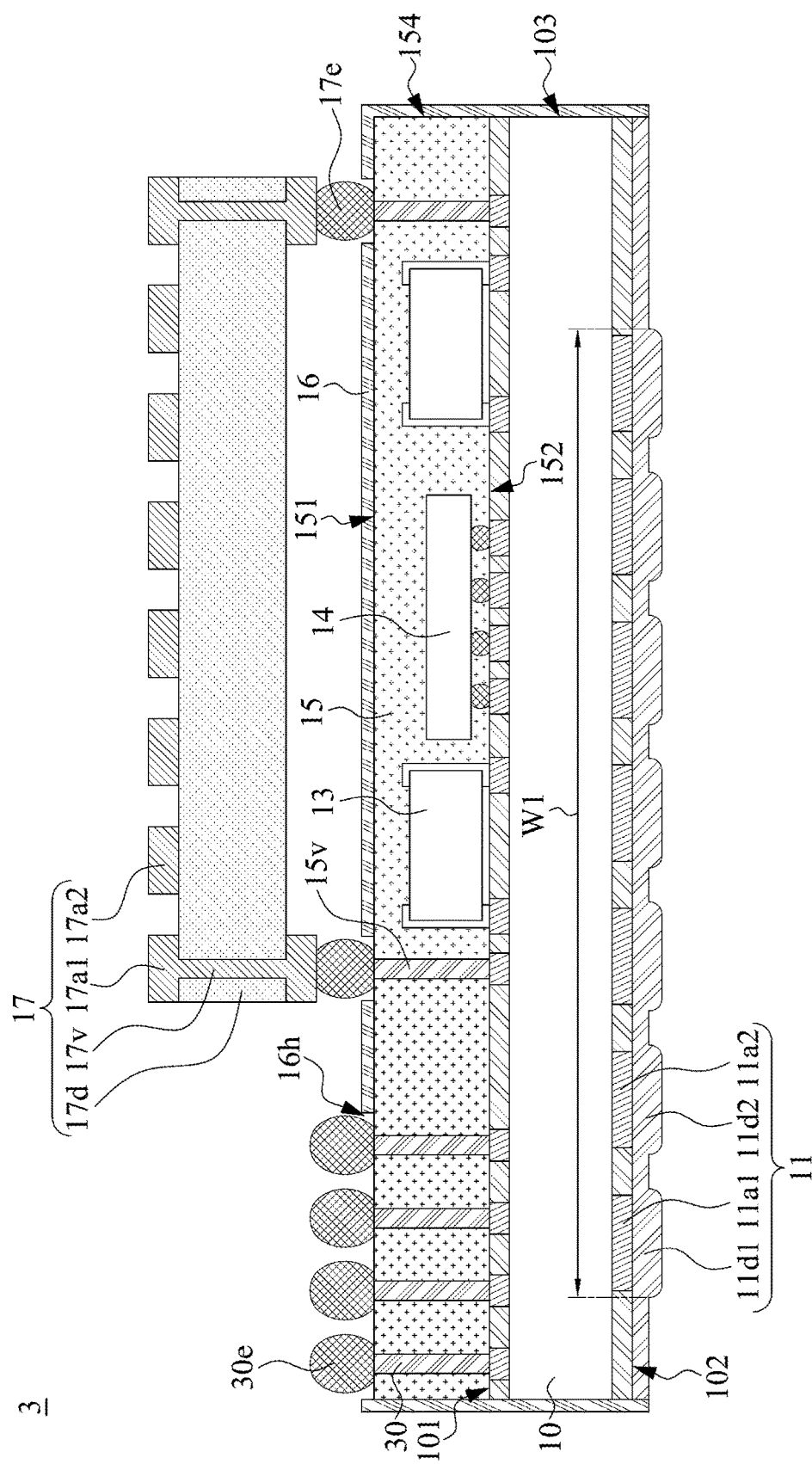
FIG. 3 is a cross-sectional view of a semiconductor device, in accordance with an embodiment of the present disclosure.

FIG. 3 is a cross-sectional view of a semiconductor device 3, in accordance with an embodiment of the present disclosure. The semiconductor device 3 is similar to the semiconductor device 1 as shown in FIG. 1A, and the differences therebetween are described below.

The semiconductor device 3 may include an interposer connection. The semiconductor device 3 may include one or more connectors 30 and one or more conductive elements 30e. The connector 30 and the conductive element 30e may be configured to provide external connections. For example, the connector 30 and the conductive element 30e can provide electrical connections between the semiconductor device 3 and external components (e.g., external circuits or circuit boards).

In some embodiments, the connector 30 may include a conductive pillar and the conductive element 30e may include a solder ball. The connector 30 may penetrate through the supporting element 15. A part of the connector 30 may be exposed from the opening 16h. The conductive element 30e may be disposed on the connector 30.

Figure 4:
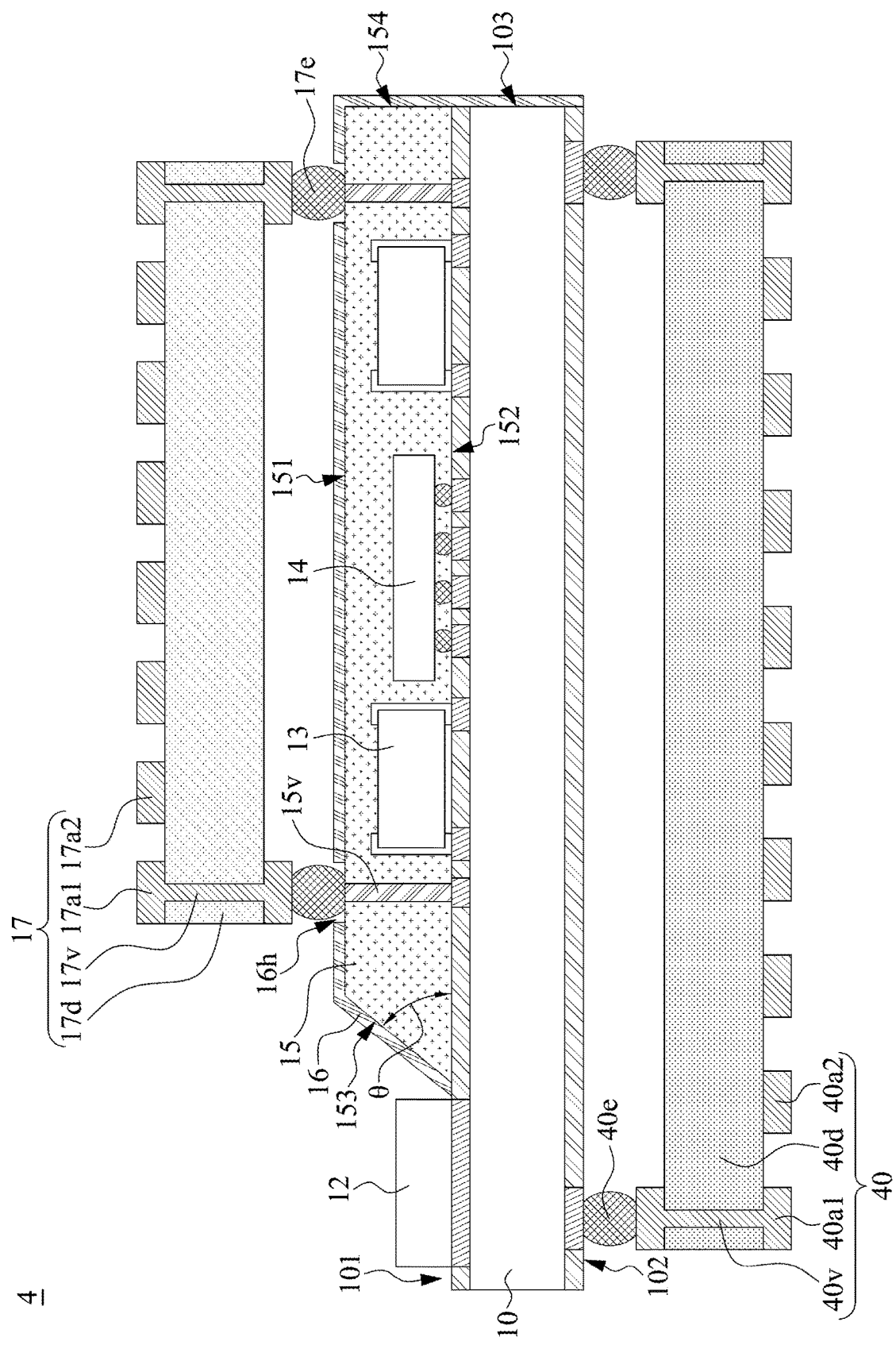
FIG. 4 is a cross-sectional view of a semiconductor device, in accordance with an embodiment of the present disclosure.

FIG. 4 is a cross-sectional view of a semiconductor device 4, in accordance with an embodiment of the present disclosure. The semiconductor device 4 is similar to the semiconductor device 1 as shown in FIG. 1A, and the differences therebetween are described below.

The semiconductor device 4 includes an antenna module 40 adjacent to or disposed on the surface 102 of the carrier 10.

The antenna module 40 may be electrically connected to the carrier 10 through conductive elements 40e. For example, the conductive elements 40e may comprise solder balls, solder bumps, copper bumps, gold bumps, or any suitable conductive means.

The antenna module 40 may be configured to radiate and/or receive electromagnetic signals different from the electromagnetic signals of the antenna module 17. The antenna module 40 may include a carrier 40d, one or more conductive elements 40v, and a plurality of antennas (or antenna elements), such as the antennas 40a1 and 40a2.

By using two antenna modules 17 and 40, the carrier 10 of the semiconductor device 4 may exclude other antennas. The antennas are disposed outside the carrier 10. The carrier 10 and the antenna modules 17 and 40 may be separately manufactured. The carrier 10 and the antenna modules 17 and 40 may be manufactured with materials, structures, and/or processes that may be relatively optimal for the semiconductor device 4.

FIG. 5A, FIG. 5B, FIG. 5C, FIG. 5D, FIG. 5E, FIG. 5F, and FIG. 5G illustrate cross-sectional views in one or more stages of a method of manufacturing a semiconductor device in accordance with an embodiment of the present disclosure. At least some of these figures have been simplified to better understand the aspects of the present disclosure. In some embodiments, the semiconductor device 1 may be manufactured through the operations described with respect to FIG. 5A, FIG. 5B, FIG. 5C, FIG. 5D, FIG. 5E, FIG. 5F, and FIG. 5G.

Figure 5A:
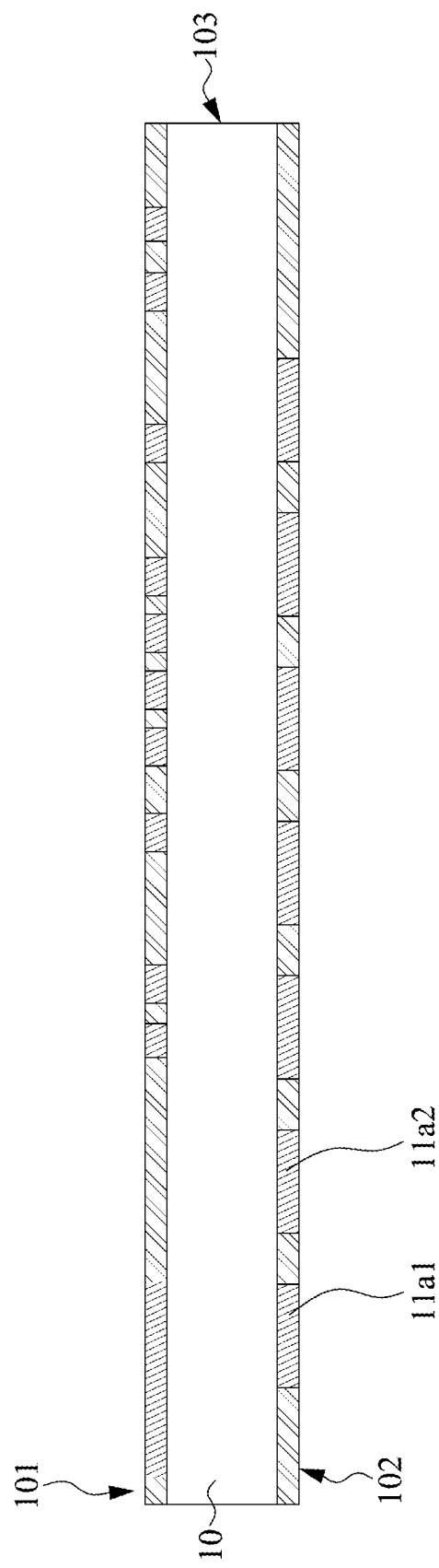
FIG. 5A, FIG. 5B, FIG. 5C, FIG. 5D, FIG. 5E, FIG. 5F, and FIG. 5G illustrate cross-sectional views in one or more stages of a method of manufacturing a semiconductor device in accordance with an embodiment of the present disclosure.

Referring to FIG. 5A, the carrier 10 is provided. The carrier 10 may have the surface 101 and the surface 102 opposite to the surface 101. The antennas 11a1 and 11a2 may be adjacent to or disposed on the surface 102 of the carrier 10.

In the present embodiment, the carrier 10 may include a copper clad laminate (CCL) substrate, which includes several carrier units wherein one may be separable from another by a scribe line (not shown). Since each of the carrier units is subjected to similar or identical processes in the manufacturing method, for convenience, only one exemplary carrier unit is detailedly described as follows.

Figure 5B:
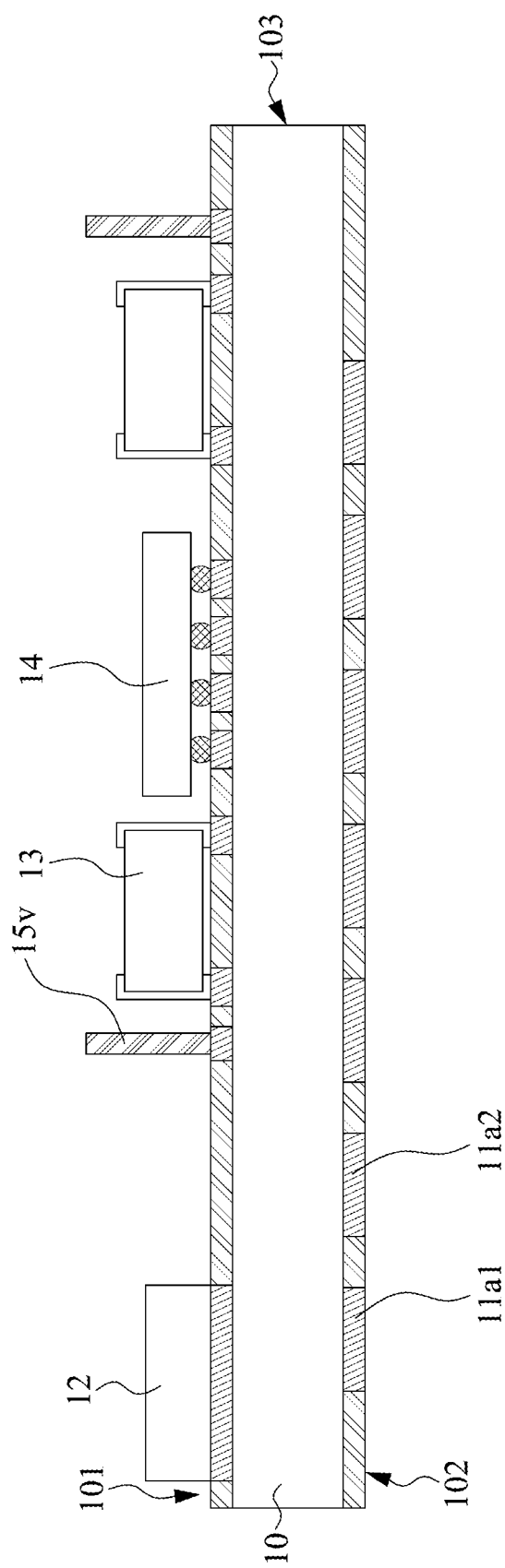

Referring to FIG. 5B, the connector 12, the electronic components 13 and 14, and the conductive element 15v are disposed on the surface 101 of the carrier 10.

Figure 5C:
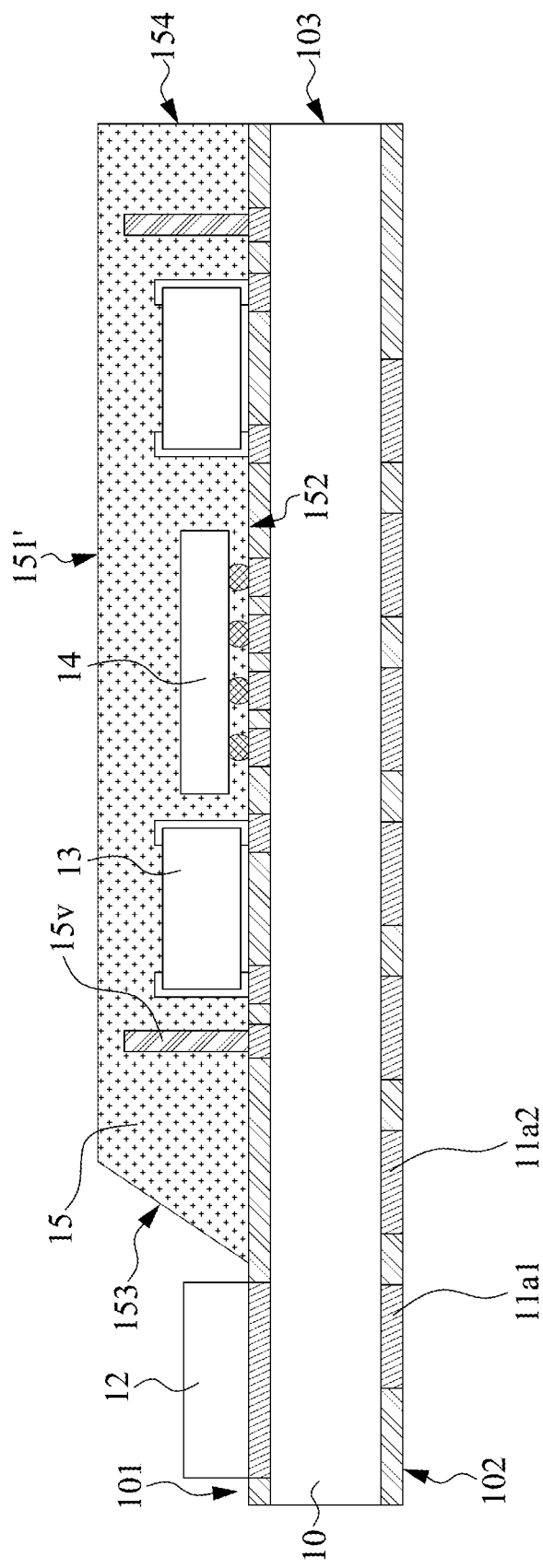

Referring to FIG. 5C, the supporting element 15 is formed on the surface 101 of the carrier 10 to cover or encapsulate the electronic components 13 and 14, and the conductive element 15v. In some embodiments, the supporting element 15 may be formed by a molding technique, such as transfer molding or compression molding. The supporting element 15 may have a surface 151'.

Figure 5D:
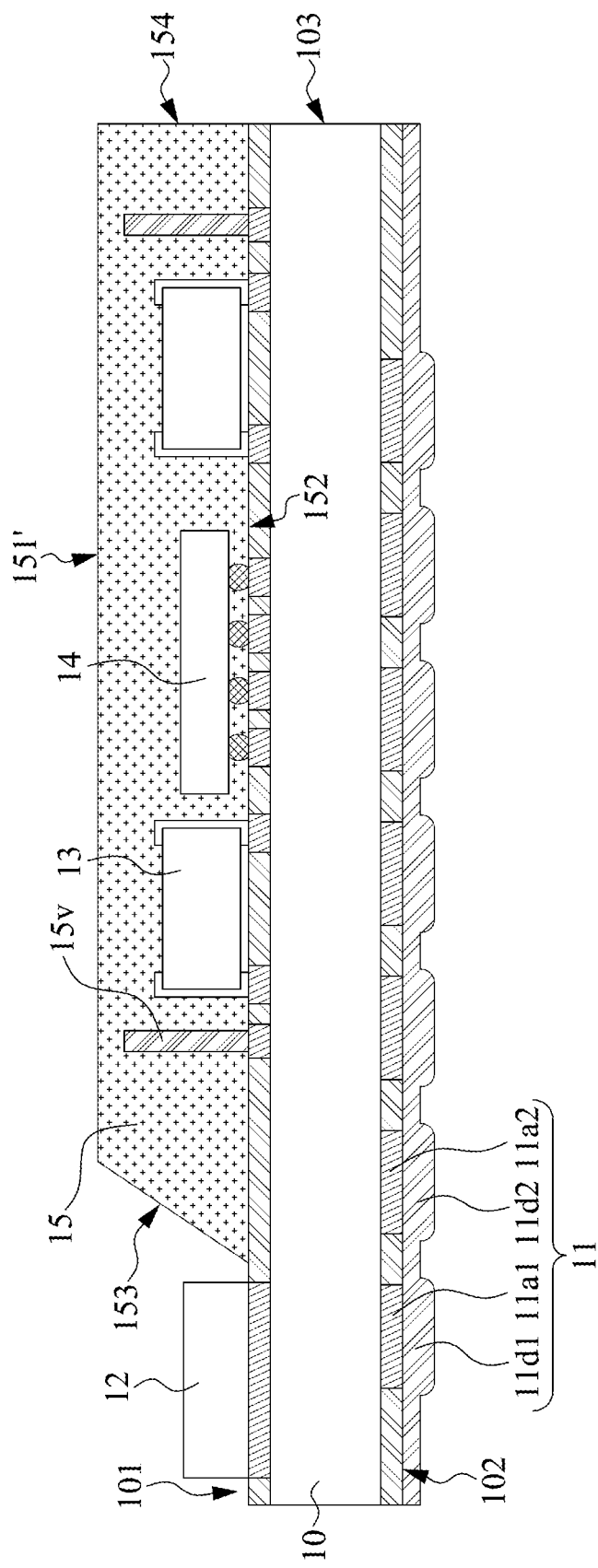

Referring to FIG. 5D, the dielectric layers 11d1 and 11d2 are disposed on the antennas 11a1 and 11a2. The dielectric layers 11d1 and 11d2 may be formed through, for example, a lamination operation.

Figure 5E:
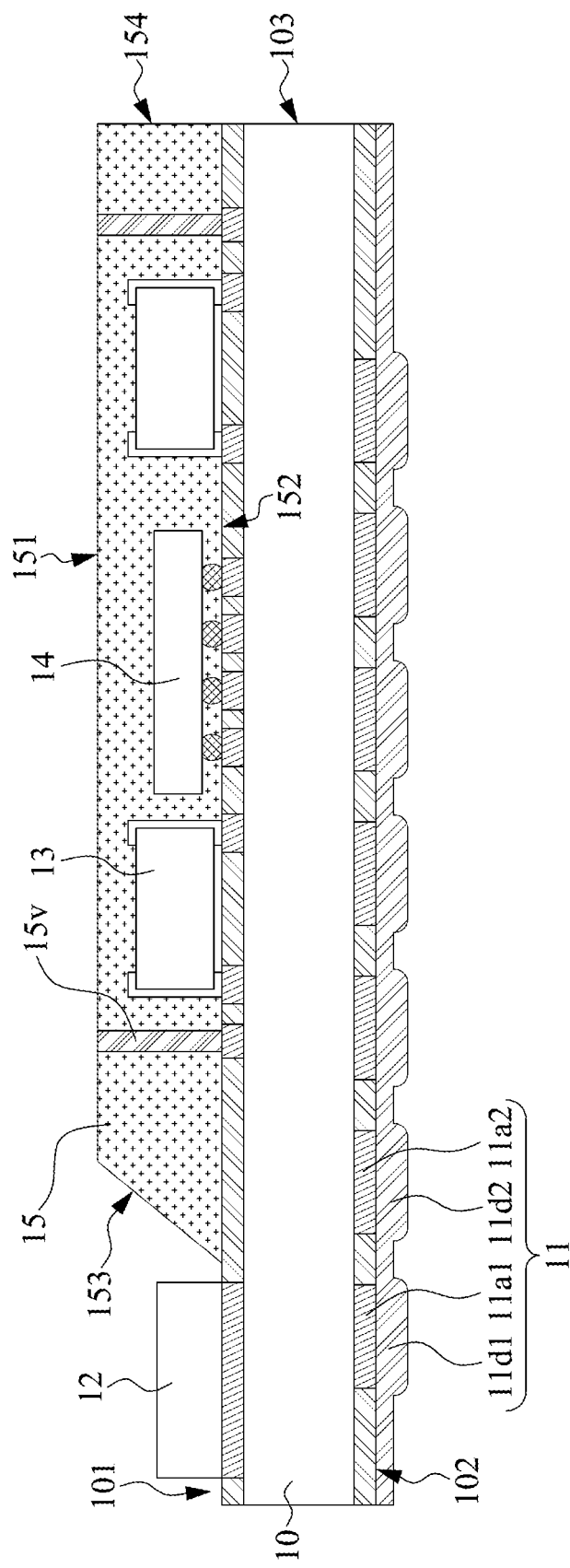
Figure 5F:
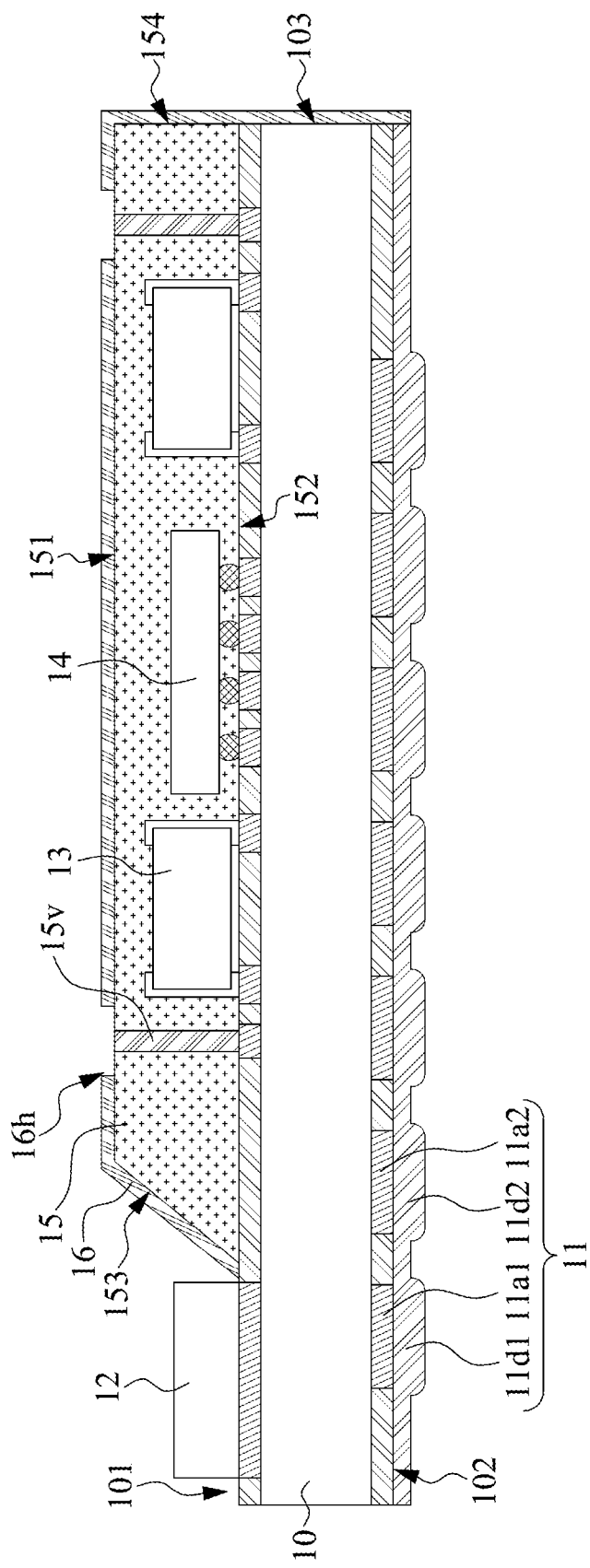

Referring to FIG. 5E, a part of the supporting element 15 may be removed to expose the conductive element 15v. The supporting element 15 may be partially removed through, for example, a grinding operation. The supporting element 15 may have a new surface 151.

Referring to FIG. 5F, the shielding layer 16 is disposed on the exposed surfaces of the supporting element 15. The shielding layer 16 may be disposed on the lateral surface 103 of the carrier 10. The shielding layer 16 may contact the grounding layer of the carrier 10.

In some embodiments, the shielding layer 16 may be disposed through, for example, physical vapor deposition (PVD), such as sputtering or spray coating. In some embodiments, the shielding layer may be disposed through chemical vapor deposition (CVD) or plating.

One or more openings 16h may be formed in the shielding layer 16 to expose the conductive element 15v.

Figure 5G:
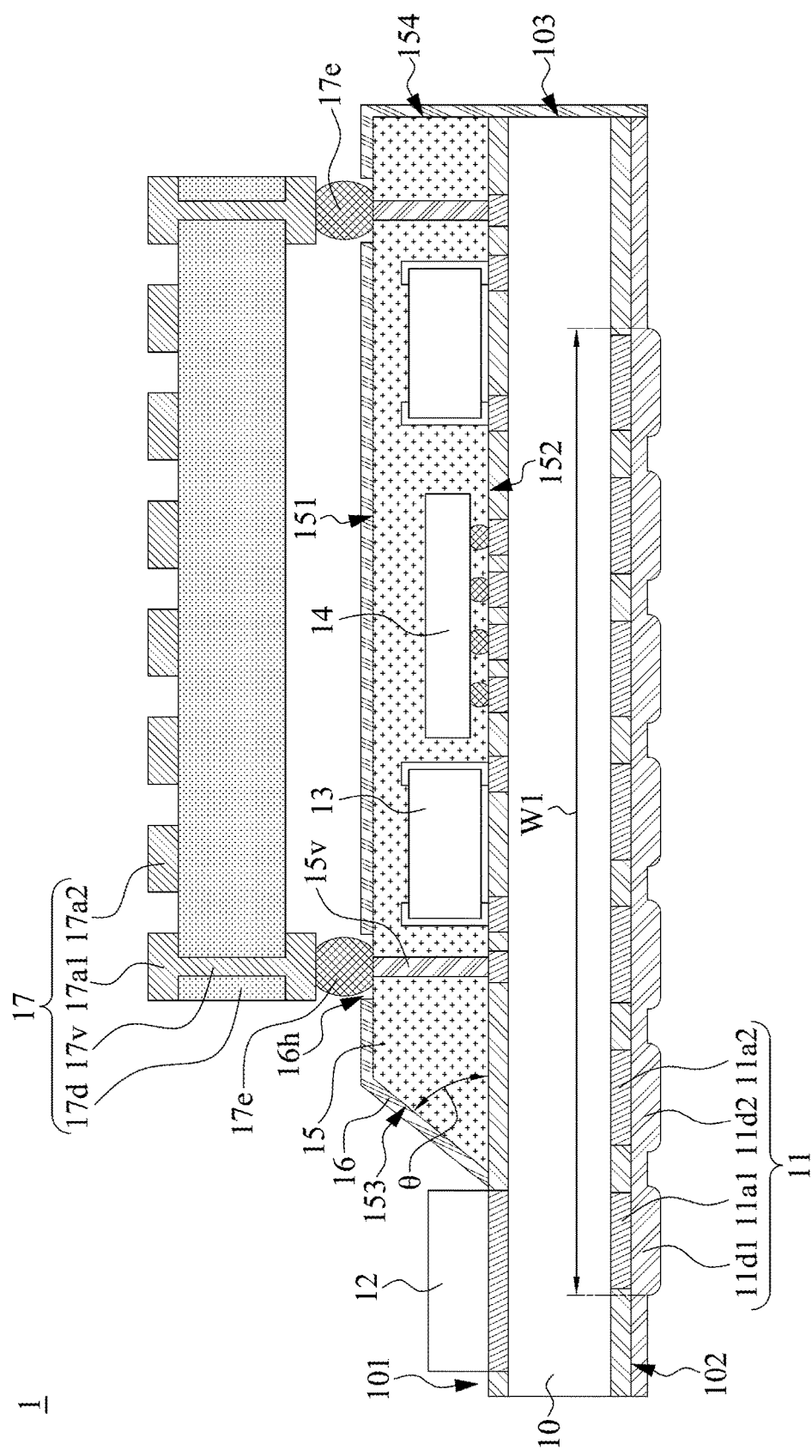

Referring to FIG. 5G, the antenna module 17 is disposed on the supporting element 15. The antenna module 17 may be electrically connected to the conductive element 15v and the carrier 10 through the conductive elements 17e.

FIG. 6A, FIG. 6B, FIG. 6C, FIG. 6D, FIG. 6E, and FIG. 6F illustrate cross-sectional views in one or more stages of a method of manufacturing a semiconductor device in accordance with an embodiment of the present disclosure. At least some of these figures have been simplified to better understand the aspects of the present disclosure. In some embodiments, the semiconductor device 3 may be manufactured through the operations described with respect to FIG. 6A, FIG. 6B, FIG. 6C, FIG. 6D, FIG. 6E, and FIG. 6F.

Figure 6A:
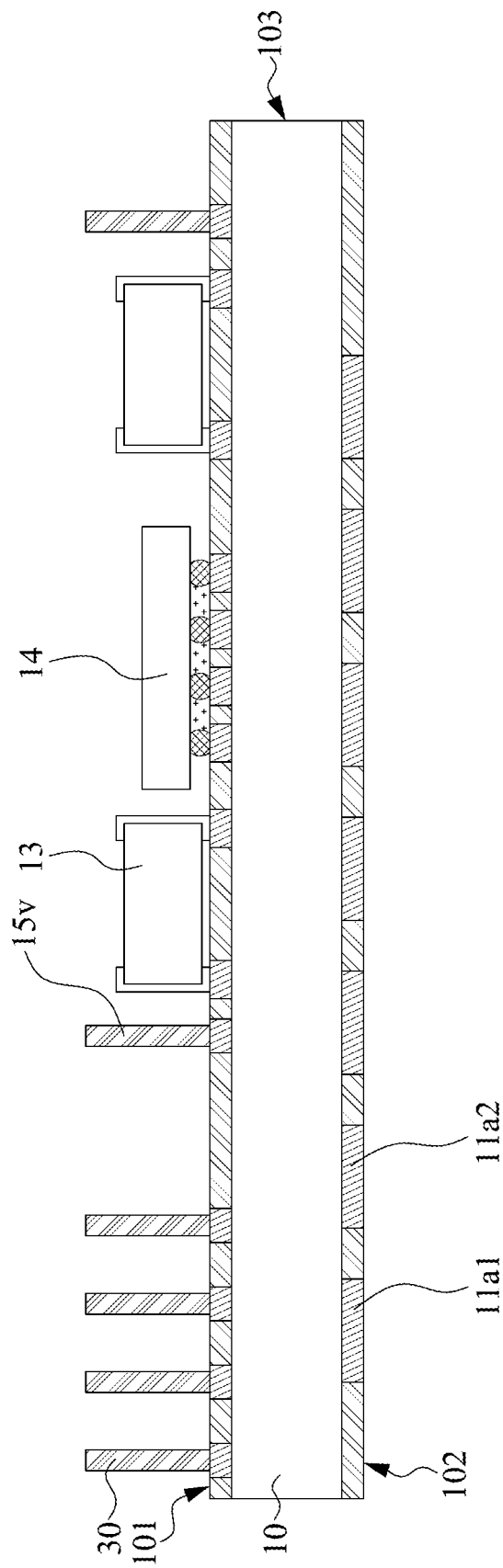
FIG. 6A, FIG. 6B, FIG. 6C, FIG. 6D, FIG. 6E, and FIG. 6F illustrate cross-sectional views in one or more stages of a method of manufacturing a semiconductor device in accordance with an embodiment of the present disclosure.

Referring to FIG. 6A, the operation thereof may be subsequent to the operation of FIG. 5A. The connectors 30, the electronic components 13 and 14, and the conductive element 15v are disposed on the surface 101 of the carrier 10.

Figure 6B:
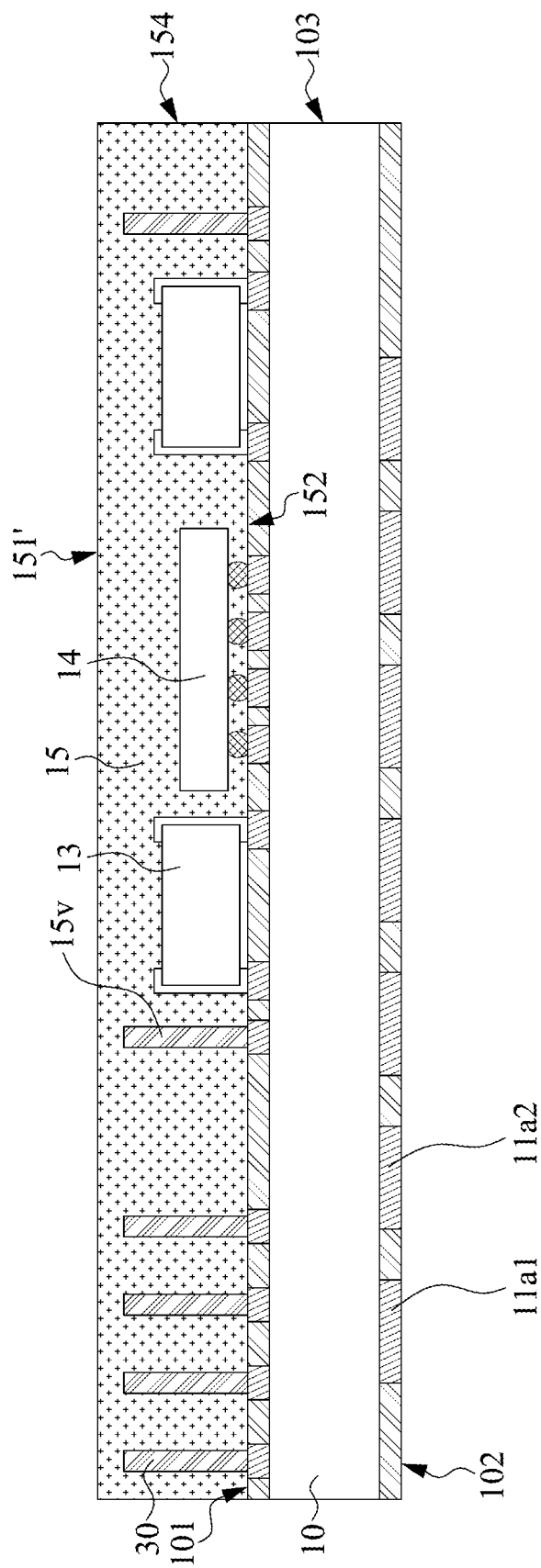

Referring to FIG. 6B, the supporting element 15 is formed on the surface 101 of the carrier 10 to cover or encapsulate the connectors 30, the electronic components 13 and 14, and the conductive element 15v. In some embodiments, the supporting element 15 may be formed by a molding technique, such as transfer molding or compression molding. The supporting element 15 may have a surface 151'.

Figure 6C:
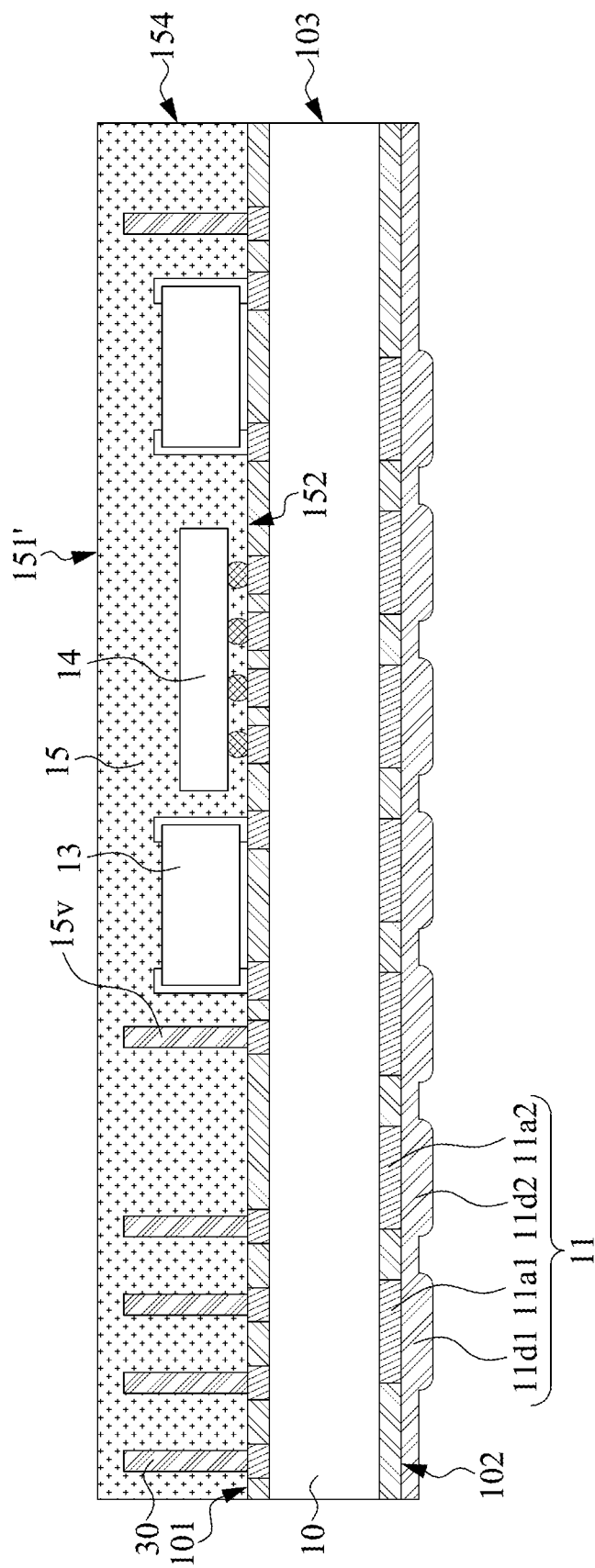

Referring to FIG. 6C, the dielectric layers 11d1 and 11d2 are disposed on the antennas 11a1 and 11a2. The dielectric layers 11d1 and 11d2 may be formed through, for example, a lamination operation.

Figure 6D:
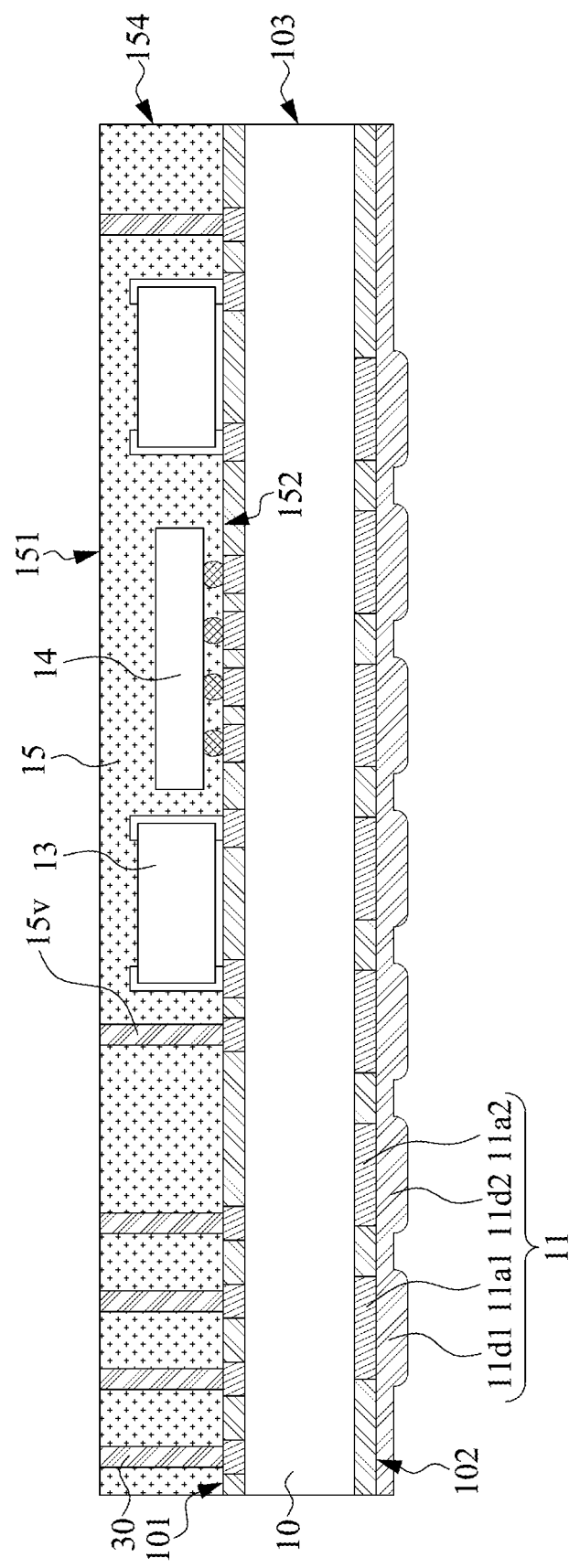
Figure 6E:
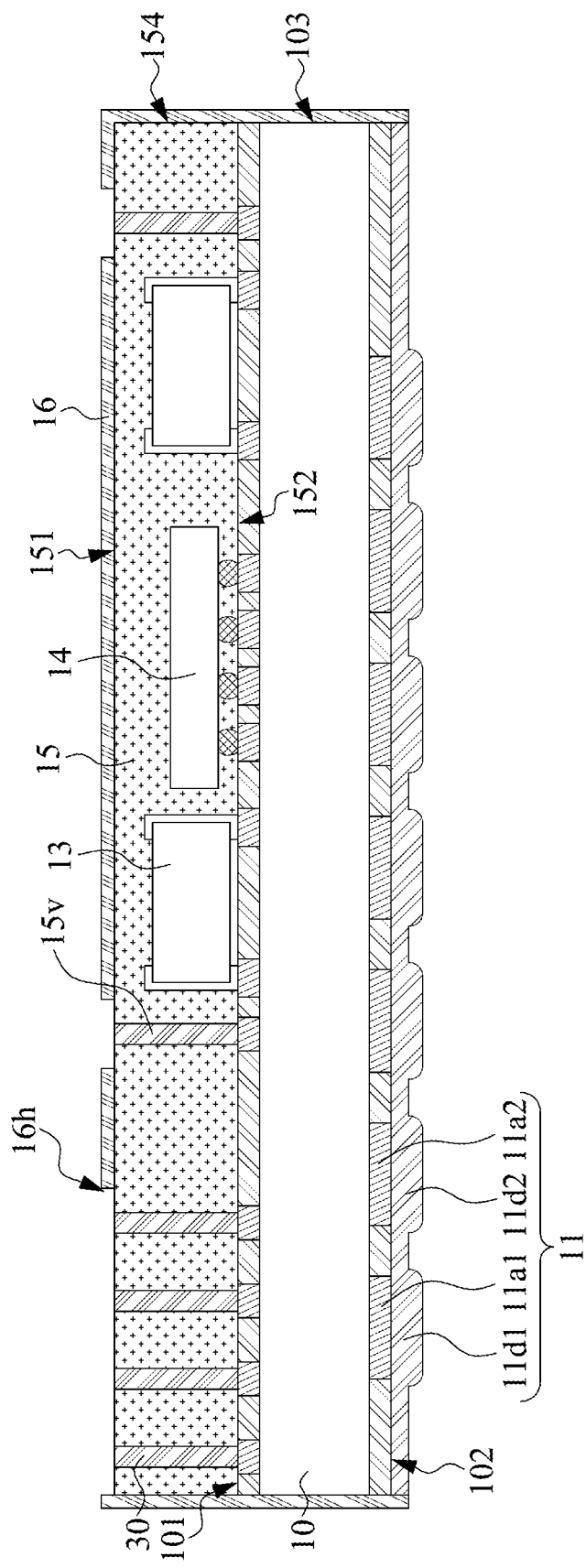

Referring to FIG. 6D, a part of the supporting element 15 may be removed to expose the connectors 30 and the conductive element 15v. The supporting element 15 may be partially removed through, for example, a grinding operation. The supporting element 15 may have a new surface 151.

Referring to FIG. 6E, the shielding layer 16 is disposed on the exposed surfaces of the supporting element 15. The shielding layer 16 may be disposed on the lateral surface 103 of the carrier 10. The shielding layer 16 may contact the grounding layer of the carrier 10. One or more openings 16h may be formed in the shielding layer 16 to expose the connectors 30 and the conductive element 15v.

Figure 6F:
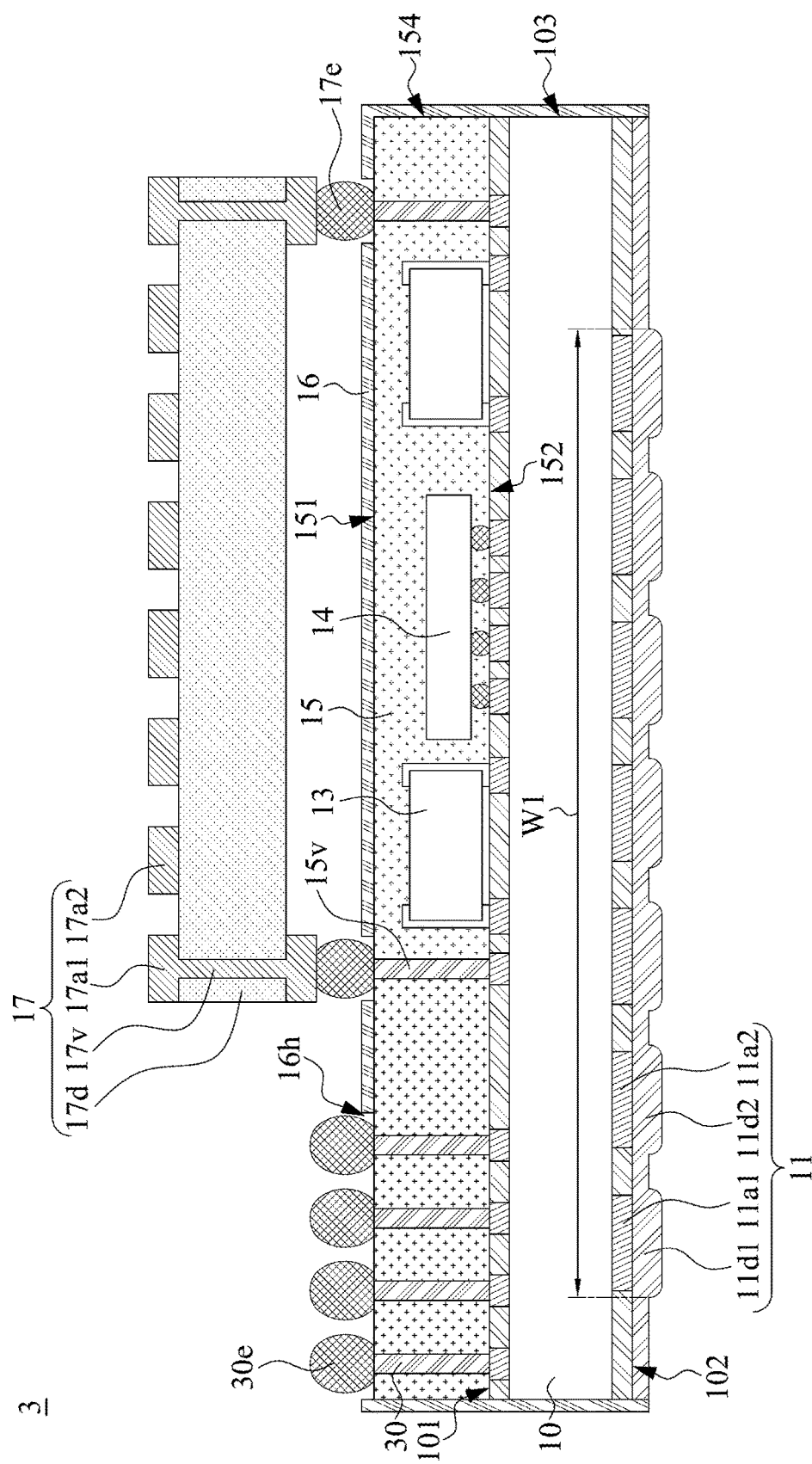

Referring to FIG. 6F, the antenna module 17 is disposed on the supporting element 15. The antenna module 17 may be electrically connected to the conductive element 15v and the carrier 10 through the conductive elements 17e.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a carrier having a first side and a second side opposite to the first side;
   a first antenna array disposed over the first side and configured to operate at a first frequency; and
   a second antenna array disposed under the second side and configured to operate at a second frequency different from the first frequency;
   a conductive element disposed over the first side of the carrier, wherein the first antenna array is electrically connected to the conductive element by a solder material.

2. The semiconductor device of claim 1, wherein the first antenna array and the second antenna array are partially misaligned with each other.

3. The semiconductor device of claim 1, further comprising:
   an encapsulant disposed over the first side of the carrier, wherein the conductive element fully penetrates the encapsulant, and wherein the second antenna array vertically overlaps the conductive element.

4. The semiconductor device of claim 1, wherein the first antenna array has a first part vertically overlaps the second antenna array and a second part free from vertically overlapping the second antenna array.

5. The semiconductor device of claim 1, further comprising:
   an encapsulant disposed over the first side of the carrier;
   a connector disposed outside the encapsulant and laterally overlapping the encapsulant,
   wherein the second antenna array vertically overlaps the connector.

6. A semiconductor device, comprising:
   a first antenna;
   a connector adjacent to the first antenna and configured to provide an external connection;
   a second antenna at least partially under the connector and the first antenna; and
   a molding compound spaced apart from the connector, wherein the molding compound overlaps the connector when viewed from a sidewall of the molding compound,
   and wherein the molding compound has an upper surface facing the first antenna and a lateral surface slanted with respect to the upper surface.

7. The semiconductor device of claim 6, wherein the lateral surface faces the connector.

8. The semiconductor device of claim 7, further comprising:
a carrier disposed between the first antenna and the second antenna, wherein the carrier has a first lateral surface and a second lateral surface opposite to the first lateral surface in a cross-sectional view, and the lateral surface of the molding compound is misaligned with the first lateral surface and the second lateral surface of the carrier.

9. The semiconductor device of claim 6, further comprising:
a carrier having a first side facing the molding compound and a second side facing the second antenna and opposite to the first side,
wherein a portion of the first side of the carrier is exposed by the molding compound.

10. The semiconductor device of claim 9, wherein the connector is disposed over the portion of the first side of the carrier.

11. The semiconductor device of claim 6, wherein the connector is configured to provide an electrical connection between the semiconductor device and an external component.

12. The semiconductor device of claim 6, further comprising:
a carrier having a first side facing the first antenna and a second side facing the second antenna, wherein a width of the molding compound is different from a width of the carrier.

13. The semiconductor device of claim 6, further comprising:
a shielding layer disposed between the first antenna and the molding compound,
wherein the shielding layer extends from the upper surface of the molding compound to the lateral surface of the molding compound.

14. The semiconductor device of claim 13, further comprising:
a conductive element penetrating the molding compound,
wherein the shielding layer defines an opening exposing the conductive element.

15. The semiconductor device of claim 14, wherein the conductive element is electrically connected to the first antenna by a solder material.

16. A method of manufacturing a semiconductor device, comprising:
disposing a supporting element on a first side of a carrier;
disposing a first antenna on the supporting element through a solder material, wherein the first antenna is configured to operate at a first frequency; and
disposing a second antenna on a second side, opposite to the first side, of the carrier, wherein the second antenna is configured to operate at a second frequency.

17. The method of claim 16, further comprising:
forming a conductive element on the first side of the carrier, wherein the supporting element is formed to cover the conductive element; and
removing a part of the supporting element to expose the conductive element after disposing the second antenna on the second side of the carrier.

18. The method of claim 17, wherein a step of removing the part of the supporting element is performed before a step of disposing the first antenna on the supporting element.

* * * * *